United States Patent
Trias

(10) Patent No.: US 7,519,506 B2
(45) Date of Patent: Apr. 14, 2009

(54) SYSTEM AND METHOD FOR MONITORING AND MANAGING ELECTRICAL POWER TRANSMISSION AND DISTRIBUTION NETWORKS

(76) Inventor: Antonio Trias, Santa Teresa n° 69-A, Torre 12, 08190 Sant Cugat del Valles (ES)

( * ) Notice: Subject to any disclaimer, the term of this patent is extended or adjusted under 35 U.S.C. 154(b) by 0 days.

(21) Appl. No.: 11/323,841

(22) Filed: Dec. 30, 2005

(65) Prior Publication Data
US 2006/0111860 A1 May 25, 2006

Related U.S. Application Data

(63) Continuation-in-part of application No. 10/702,293, filed on Nov. 6, 2003, now abandoned.

(60) Provisional application No. 60/424,351, filed on Nov. 6, 2002.

(51) Int. Cl.
*G06F 11/30* (2006.01)

(52) U.S. Cl. ............ 702/182; 702/57; 702/60; 702/65; 700/286; 700/291; 703/18

(58) Field of Classification Search ............ 702/57, 702/60, 61, 62, 64, 65, 182, 183; 700/286, 700/291, 295; 307/103, 147; 703/3, 4, 13, 703/18

See application file for complete search history.

(56) References Cited

U.S. PATENT DOCUMENTS

| | | | | |
|---|---|---|---|---|
| 3,903,399 A | * | 9/1975 | Enns et al. | 703/3 |
| 4,868,410 A | * | 9/1989 | Nakamura | 307/20 |
| 5,642,000 A | * | 6/1997 | Jean-Jumeau et al. | 307/31 |
| 6,486,569 B2 | * | 11/2002 | Couture | 307/98 |
| 6,496,757 B1 | * | 12/2002 | Flueck et al. | 700/292 |
| 6,625,520 B1 | * | 9/2003 | Chen et al. | 700/286 |
| 6,785,592 B1 | * | 8/2004 | Smith et al. | 700/291 |
| 6,904,374 B2 | * | 6/2005 | Nachamkin | 702/65 |
| 2001/0040446 A1 | * | 11/2001 | Lapinksi et al. | 324/126 |
| 2003/0040846 A1 | * | 2/2003 | Rehtanz et al. | 700/292 |
| 2003/0160457 A1 | * | 8/2003 | Ragwitz et al. | 290/44 |
| 2006/0047370 A1 | * | 3/2006 | Chu et al. | 700/292 |
| 2006/0229767 A1 | * | 10/2006 | Chu et al. | 700/286 |

OTHER PUBLICATIONS

Okumura et al., "A computation of power system characteristic by general homotopy and investigation of its stability", IEEE International Symposium on Circuits and Systems, 1992, vol. 6, May 3-6, 1992 pp. 2745-2748.*

(Continued)

*Primary Examiner*—Jeffrey R West
(74) *Attorney, Agent, or Firm*—Whiteford, Taylor & Preston, LLP; Jeffrey C. Maynard

(57) ABSTRACT

A system and method for monitoring and managing electrical power transmission and distribution networks through use of a deterministic, non-iterative method using an holomorphic embedding and algebraic approximants for determining the real-time load flow in a power generating system having an electrical grid. Such method may be employed for real-time or off-line applications for electric power systems reliability assessment, and is capable of determining whether or not a physical solution to the load flow problem exists, or if the system is in a state of voltage collapse.

8 Claims, 4 Drawing Sheets

OTHER PUBLICATIONS

Numerical Recipes, "5.2 Evaluation of Continued Fractions", Cambridge University Press, 1988-1992, www.library.cornell.edu/nr/cbookcpdf/html.*

Liao, "Numerically solving non-linear problems by the homotopy analysis method", Computational Mechanics 20 (1997), pp. 530-540.*

Wikipedia, "Holomorphic function" (Dec. 13, 2005) "Taylor series" (Dec. 24, 2005), http://en.wikipedia.org.*

Tolikas et al., "Homotophy methods for solving decoupled power flow equations" IEEE International Symposium on Circuits and Systems, 1992, vol. 6, May 3-6, 1992 pp. 2833-2839.*

Zhigang et al., "A new method to calculate multiple power flow solutions" 2000 International Conference on Advances in Power System Control, Operation and Management, vol. 2, Oct. 30-Nov. 1, 2000 pp. 491-495.*

Salam et al., "Parallel processing for the load flow of power systems: the approach and applications" Proceedings of the 28th IEEE Conference on Decision and Control, Dec. 13-15, 1989 pp. 2173-2178.*

Guo et al., "The homotopy continuation method to approach voltage collapse of electric power systems" IEEE International Symposium on Circuits and Systems, 1993, vol. 4, May 3-6, 1993 pp. 2644-2647.*

Freeman, "Electric utilities say goodbye to good enough", Nov. 21, 2002. http://uaelp.pennnet.com/Articles/Article_Display.cfm?Section=ONART&Subsection=Display&ARTICLE_ID=162054&KEYWORD=elequant.*

Hwang et al., "Solution of General Padé Fitting Problem Via Continued-Fraction Expansion" IEEE Transactions on Automatic Control, vol. 32, Issue: 1 Jan. 1987 pp. 57-59.*

Culot et al., "A quasi-Newton algorithm for first-order saddle-point location", Theoretical Chemistry Accounts: Theory, Computation, and Modeling, vol. 82, Nos. 3-4 / May 1992, pp. 189-205.*

Shah et al., "An Algorithm for Simulating Power/Ground Networks using Padé Approximants and its Symbolic Implementation", IEEE Transactions on Circuits and Systems II: Analog and Digital Signal Processing, vol. 45, Issue: 10, Oct. 1998 pp. 1372-1382.*

* cited by examiner

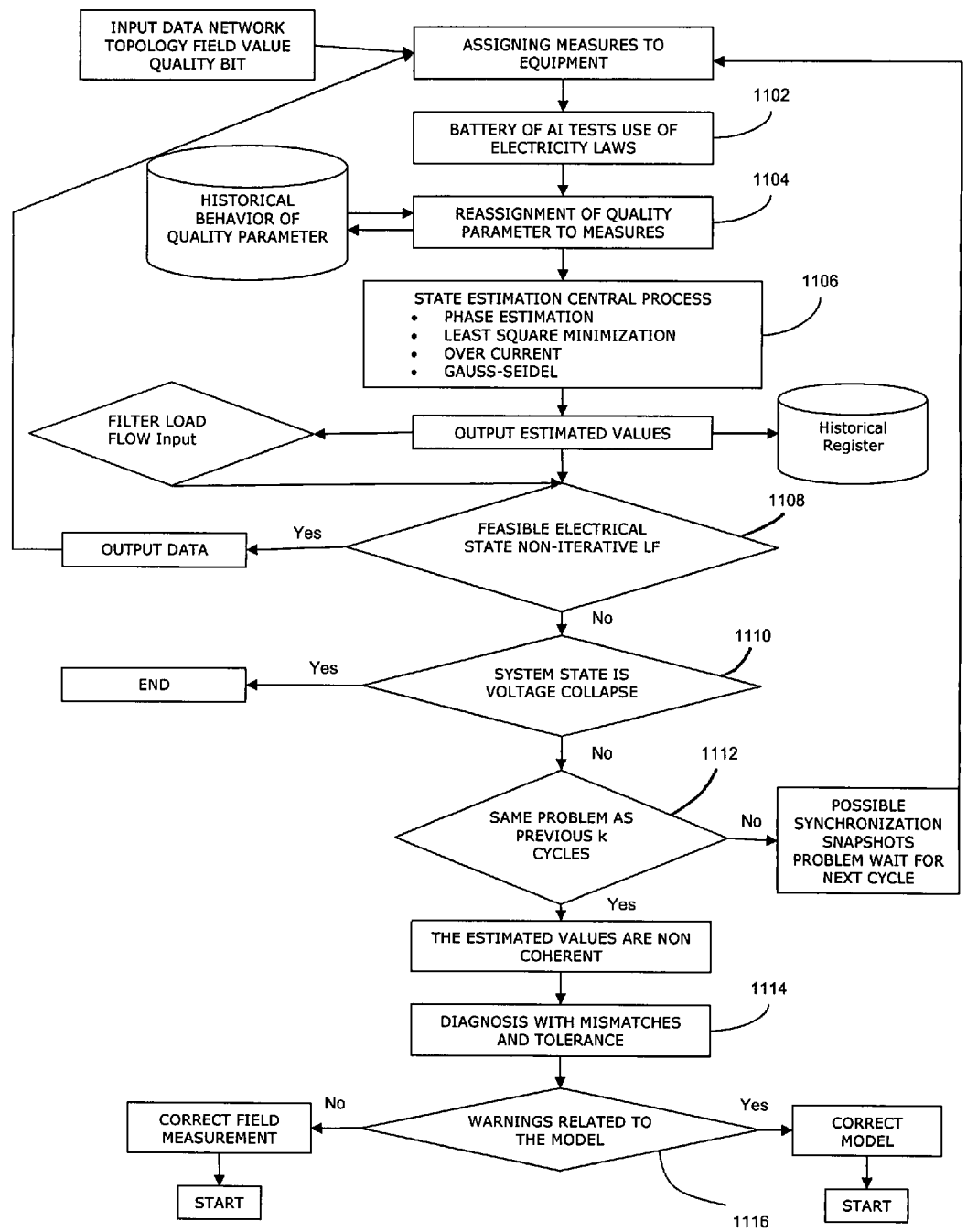

SYSTEM AND METHOD FOR MONITORING AND MANAGING ELECTRICAL POWER TRANSMISSION AND DISTRIBUTION NETWORKS

CROSS-REFERENCE TO RELATED APPLICATIONS

This application is a continuation-in-part of and co-owned U.S. patent application Ser. No. 10/702,293 entitled "System and Method for Monitoring and Managing Electrical Power Transmission and Distribution Networks", filed with the U.S. Patent and Trademark Office on Nov. 6, 2003 now abandoned, by the inventor herein, which is based upon and claims benefit of copending and co-owned U.S. Provisional Patent Application Ser. No. 60/424,351 entitled "Method and System for Monitoring and Managing Electrical Power Transmission and Distribution Networks", filed with the U.S. Patent and Trademark Office on Nov. 6, 2002, by the inventor herein, the specifications of which are incorporated herein by reference.

BACKGROUND OF THE INVENTION

1. Field of the Invention

The present invention relates to monitoring and management of electrical power transmission and distribution networks, and more particularly to a system and method for determining the grid state and transmission line capacity of such a network by determining the network load flow using a deterministic, non-iterative, real time analysis of the network.

2. Description of the Background

The global electric industry is facing a number of challenges: an aging infrastructure, growing demand, and rapidly changing markets, all of which threaten to reduce the reliability of the electricity supply. Currently, deregulation of the electricity supply industry continues, although somewhat more cautiously than before due to California's recent experience. Deregulation and the drive to increase efficiencies in power systems have been particularly relevant in the attempt to develop new processes for intelligent observation and management of the grid.

Increasing demand due to economic and demographic variations, without additional generation investments, has led transmission and distribution systems worldwide to their limits of reliable operation. According to the North American Electric Reliability Council (NAERC), transmission congestion is expected to continue over the next decade. Growth in demand and the increasing number of energy transactions continue to outstrip the proposed expansion of transmission system. In the same line, the Edison Electric Institute indicates that the U.S. transmission system requires nearly $56 billion in new investment over the next decade, but only $35 billion is likely to be spent. Figures from the Federal Energy Regulatory Commission (FERC) place the total transmission congestion costs nationwide at several hundred million dollars.

One action FERC is taking to improve coordination on the US grid is to create Regional Transmission Organizations (RTOs). Yet, even this important step towards nationwide coordination raises concerns about transmission reliability. In its report, "Reliability Assessment 2001-2010," the NAERC stated, "The transition period from existing grid operation arrangements to the new world of RTO-managed grids may create some negative system reliability impacts. New system and organizational structures will need to be implemented over very aggressive time lines." Furthermore, the Transmission Rights market is just beginning. In the US FERC, as a result of three conferences, issued a working paper where the important characteristics were defined: LMP (Location Marginal Pricing) as the system for congestion management, the availability of a non-discriminatory standard "Network Access Service," RTO operation bid based day ahead and spot markets, holder's ability to sell transmission rights, and mitigation through market bidding rules.

Therefore, today more than ever before, the need exists for adequate methods for determining the basic functions that provide System Operators and Regional Transmission Organization managers with the best knowledge on their existing grid. Tools that help reduce the uncertainty or "fuzzy-zone" for safety operations with accurate computation of the grid state and transmission lines capacity are therefore required.

The primary objective of operation and security management is to maximize infrastructure use while concurrently reducing the risk of system instability and blackouts. One specific type of transmission system voltage instability is the slow spreading uncontrollable decline in voltage known as voltage collapse.

Electricity providers try to avoid power disruption to their customers. From a momentary interruption to a full blackout, any disturbance is costly to the provider and consumers alike. Six days of rolling blackouts in 2001 cost Silicon Valley businesses more than $1 billion according to the San Jose Mercury News. A report released by the Electric Power Research Institute's (EPRI) Consortium for Electrical Infrastructure to Support a Digital Society (CEIDS) notes that U.S. businesses lose over $45 billion annually from outages.

The electrical power network is represented through the power system model by means of an accurate representation of all of its components: bus bars, lines, transformers, loads, generators, DC couplings, shunts, etc. These elements are modeled using a set of values defining its state (voltage, angle, and active and reactive power for nodal elements and complex flows for link elements). These values are not independent. They must satisfy the Ohm and Kirchov Laws, which for these variables becomes a system of non-linear equations.

This system of equations well known as the Load Flow or Power Flow equations can or cannot have a solution (Voltage Collapse) and the mathematical solution to this problem normally is multiple, with a degree of multiplicity as high as $2^N$ where N is the number of buses in the network. From this set of $2^N$ solutions, only one corresponds to the physical situation. The rest of the solutions are spurious and cannot represent the physical solution of a real power system. A standard approach to this highly nonlinear problem has been the use of numerical approximation methods.

The topology of the actual representation can vary if the model is only detailed up to bus bar level, which may suit off-line studies for Planning Engineers. Yet for operations, the model must reach switching levels. Modeling for other purposes can also be done, as described in U.S. Pat. No. 6,202,041 to Tse et al., which discloses a modeling method for small perturbation stability, as well as U.S. Pat. No. 6,141,634 to Flint et al., which discloses an AC power line network simulator.

Real time instruments in the field measure some of these parameters that are sent through communication lines to centralized control centers. SCADA (Supervisory and Data Acquisition) Systems are the basic hardware-software basis for observation and operation of a power system network (alarms, Automatic Generation Control or "AGC," etc.), and EMSs (Energy Management Systems) include more advanced software applications that implement the process of information transformation within such control centers calculating load flow, optimal power flow, contingency analysis, etc. For example, U.S. Pat. No. 5,181,026 to Granville discloses a system for measuring voltage, phase angle, and line temperatures in power lines.

A power system model with a complete set of exact measurements for all parameters is not possible; hence, observation of real values is limited to a subset of all needed parameters. The remaining values must be estimated. Therefore, to a given set of real time values at an instant t are added the corresponding complementary estimated values. In order to represent a feasible electrical state of the power system, these values must satisfy the Load Flow equations. Hence, at the heart of any real time system modeling lie two basic processes: state estimation and load flow equations solving methods.

Most state estimation methods today define an external model (being the neighboring power systems' topology and values) and propagate voltage values to the internal model that of the given power system. It is a least square function minimization process of the differences between the real measured values and the estimated values.

The standard methodology for solving the load flow equations problem has been to use the Fast Decoupled Newton-Raphson (FDNR) algorithm. This methodology presents two majors drawbacks:

a) Even in the case where there is a solution, FDNR may not be able to find it, due to the fractal nature of the convergence region of this algorithm. This is inherent to the iterative nature of the Newton-Raphson Methodology.

b) FDNR cannot assure that a solution (one that solves the mathematical equations) really represents the physical one. Newton-Raphson can jump from the neighborhood of one solution to the neighborhood of another in an uncontrollable way.

The problems of the FDNR methodology are well known by the electrical sector, taking the form of stochastic non-convergence or dependency of the result in the order of the actions over the network.

Several attempts to overcome these difficulties have been undertaken in the past, but with limited success. For example, load flow and state estimators currently used in electrical advanced applications at control centers represent the state-of-the-art technology: Newton-Raphson Iterative methodology, as well as variants for improving convergence and speed of computation (Fast decoupling, etc.), avoiding triangulation of the Jacobian, as well as new approaches using fuzzy logic and genetic algorithms.

An interesting approach to the load flow equations solutions is the use of the General Homotopy Method proposed by Okumura et al., "A computation of Power System Characteristic by General Homotopy and Investigation of its Stability", in which is defined a family of solutions characterized by a continuous real parameter defining a path. The path must be followed step-by-step using a predictor-corrector methodology involving Newton-Raphson in each step. In order to avoid the inherent Newton-Raphson drawbacks, the step size must be carefully chosen in order not to lose the path to the solution.

Other approximations to the load flow equation solutions include Tolikas et al. "Homotopy Methods for solving Decoupled Power Flow equations" or Guo et al., "The Homotopy Continuation Method to Approach Voltage Collapse of Electric Power Systems". Any of the approaches results are reliable enough and efficient for industrial use in a real time environment.

The list of references on this matter is not exhaustive but its length indicates that it is a problem yet to be solved to complete satisfaction.

Once the model of the power system is validated as an accurate one (model topology has been improved and quality of measurements has been attained or at best ranked adequately), through state estimation and load flow calculation, many other processes typically take place within an EMS operator working environment, including:

1) Limit violation control of parameters outside operating limits. These processes may comprise intelligent methods that generate proposed remedial actions by means of using load flow on the last estimated snapshot or state of the power system by the EMS State Estimator automatically (by means of an algorithm) or manually using a real time network simulation by the operator. Some physical devices, such as protections and others with or without local intelligence, have also been developed as alternatives, including U.S. Pat. No. 5,428,494 to Ahuja, which presents a system for over-voltage and under-current protection, and U.S. Pat. No. 5,327,355 to Chiba et al., which presents a fuzzy logic based method for tap transformer settings for voltage control. Extreme remedial action always involve load shedding, which process is treated in some form in U.S. Pat. No. 4,324,987 to Sullivan, II et al., U.S. Pat. No. 4,337,401 to Olson, U.S. Pat. No. 4,583,182 to Breddan, and U.S. Pat. No. 5,414,640 to Seem. A method for controlling voltage and reactive power fluctuations in adjacent power systems is discussed in U.S. Pat. No. 6,188,205 to Tanimoto et al.

2) Planned maintenance outages assessment through instant real time on line simulation from the actual network state.

3) Optimal power flow for objective functions such as losses minimization through reactive power cycling.

4) Voltage stability analysis, which can be viewed as the aggregation of the following:

a. PV and QV curves construction.

b. Determination of voltage collapse point and current operating point as well as voltage stability criterion.

c. Generating a metric to voltage collapse. One such example is the margin to voltage collapse defined as the largest load change that the power system may sustain at a set of buses from a well-defined operating point, as described in U.S. Pat. No. 5,745,368 to Ejebe et al.

d. Voltage stability assessment and contingency analysis and classification. Concerning voltage stability security assessment, state of the art load flow methodologies in general do not work. A well detailed explanation on which of these tasks they tend to fail can be found on U.S. Pat. Nos. 5,594,659 and 5,610,834 to Schlueter. Because of this, Newton-Raphson is ill conditioned for the situation. In the cited patents, Schlueter states that current methods lack diagnosis procedures for determining causes of specific voltage instability problems, as well as intelligent preventive procedures. His method is an attempt to overcome this situation in certain cases. He provides for detecting if certain contingencies (line outages and loss of generation) related to reactive reserve basins can cause voltage instability.

Another approach is that given in U.S. Pat. No. 5,642,000 to Jean-Jumeau et al. where a performance index is related to the load demand and not to voltage for the first time. This index allows for determining the amount of load increase the system can tolerate before the collapse, and when collapse is to be originated by a contingency, it gives a measure of its severity. It overcomes the computational burden of the high non-linearity of order $2^N$ by inventing a new characteristic linear equation of the exact saddle-node bifurcation point of order N: "Decoupled, parameter-dependent, non-linear (DPDN) dynamic systems as ones whose dynamics can be represented by a set of non-linear equations with a varying parameter that can de decoupled from the remainder of the equation".

A method in U.S. Pat. No. 4,974,140 to Iba et al. discloses discriminating voltage stability from the method of multiple load flow solutions.

Also, U.S. Pat. No. 5,745,368 to Ejebe et al. compares three approaches to determining an alternative voltage collapse point and an index, using a comparison of the method introduced: the Test Function Method (TFM) with two other prior art existing methods, namely, Continuation Power Flow (CPF) and Multiple Load Flow Method (MLF).

Other approaches that are innovative yet still inefficient include those of U.S. Pat. No. 5,629,862 to Brandwajn et al. using artificial intelligence rule-based systems, or U.S. Pat. No. 5,625,751 to Brandwajn et al. for contingency ranking.

e. Future near-term dynamic voltage stability. One such example for a near term definition of 25 minutes is U.S. Pat. No. 5,796,628 to Chiang et al. where system voltage profiles are predicted and loads and contingencies are analyzed on this near-term scenario in terms of load margins to collapse. Continuation load flow technique CPFLOW (predictor corrector type of continuation power flow with a step-size control) through the nose of PV QV curves (saddle-node bifurcation) is reported to work without numerical difficulties. Yet, the patent preferred embodiment describes the sensitivity of the number of final iterations to the attainment of a good approximation point for the next solution by the predictor. It is also stated that good step-size controls are usually custom-designed for specific applications. So again, there is some craftsmanship as in all PV QV curve construction using any derived method from Newton-Raphson iterative process.

5) On-Line transient stability. This is a more ambitious task, entering the realm of the differential equations where the right hand term is a load flow equation. U.S. Pat. No. 5,638,297 to Mansour et al. defines via an artificial contingency on-line transient stability assessment.

6) Load forecast. We list here this process even though it is not related to load flow methodologies because knowing the forecasted load profile will help in many instances while analyzing future contingencies and generating action plans (limits back to normal, restoration). Standard methodologies used by successful methods include the more classical autoregressive methods (ARIMA) Box Jenkins time series approach, as well as more recent artificial intelligence neural network approaches.

7) Disturbance detection and restoration.
a. For distribution grids, the problem is simpler and well known. Restoration can be managed through a set of rules (small expert systems) since the topology is radial. State of the art is mostly centered in fault location and its resolution as well as protection schemes by different standard and creative ways. Patents include U.S. Pat. No. 5,303,112 to Zulaski et al., U.S. Pat. No. 5,455,776 to Novosel, U.S. Pat. No. 5,568,399 to Sumic, U.S. Pat. No. 5,684,710 to Ehlers et al., U.S. Pat. No. 5,973,899 to Williams et al., U.S. Pat. No. 6,185,482 to Egolf et al., and U.S. Pat. No. 6,347,027 to Nelson et al.
b. For transmission grids, the restoration problem has not been solved satisfactorily as a general universal procedure valid for any power system network. With ageing infrastructures and growing demand, disturbances are increasingly likely to happen. Traditionally, restoration after a disturbance has been one of the most difficult things for electrical companies to handle. While hundreds of hours of systems analysis and documentation go into restoration plans, they never match the reality of any specific disturbance, and they are dynamic in nature. Automatic tools for helping operators have been attempted. Avoiding the need for local rules specification would be desired. Detection is related to intelligent alarm and topology changes processing. Restoration plan validation by the operator requires load flow calculation after each step in order to guarantee a feasible electrical network state after each and every action, with the post-disturbance steady state as initial condition of the action plan.

As we have seen, all of the above central processes need a working, real-time load flow method. The methodologies on which the industry has based, up until now, the on-line real time monitoring and managing of networks as well as off-line analysis tools for planning, programming, and for investing decisions support, generally behave well under certain continuity of the network condition. Iterative in nature, they need initial points near the solution or equivalent knowledge of the previous solution to compute the next stage in a real time environment. This last aspect is responsible for not being able to behave well when disruptions of the system state take place, when a major disturbance or blackout takes place. To conclude, we add that when the electrical network state is close to voltage collapse, precisely when operators and planners need the support of these tools the most, traditional methods fail and frequently cannot deliver a correct calculation.

SUMMARY OF THE INVENTION

Disclosed herein is a deterministic non-iterative method that improves the existing methods to solve the load flow equations of any power system. Such method in turn provides improved methods for state estimation, generation of restoration plans, the construction of PV and QV curves, voltage stability and contingency analysis, optimal power flow, and operation limits control.

In a preferred embodiment of the method of the invention, a physical solution of the central load flow problem is found using the following steps:

a) Embed the load flow problem in a holomorphic embedding that goes continuously from the no load case (case for which there is no load, nor generation, and consequently no flow in the lines) to the problem case;

b) Develop, in power series, the values of the equation's unknowns in the parameter(s) of the embedding in a neighborhood of the no load case value of the parameter; and c) Use analytical continuity (by an n-order algebraic approximant) to find the value for the equation's unknowns in the problem case.

For suitable analytical continuation techniques using algebraic approximants (continued fractions, for instance), the above-described procedure always gives the correct solution (i.e., the physical one) when it exists. If no solution exists, then we are at the voltage collapse state of the power system. The present invention thus relates to a constructive method for finding such a solution (or determining that no solution exists and thus that the system is at voltage collapse), and a system for employing such method.

DESCRIPTION OF THE DRAWINGS

FIG. 4 is a schematic representation of a method employing a load flow determination method of the invention for purposes of performing state estimation.

DETAILED DESCRIPTION OF THE PREFERRED EMBODIMENTS

To illustrate the well-known fact of the ill condition of the existing state of the art methodology in the vicinity of voltage collapse, we will use a very simple example of a very small network with final quadratic load flow equations (exact solutions are easily computed).

Figure 1:
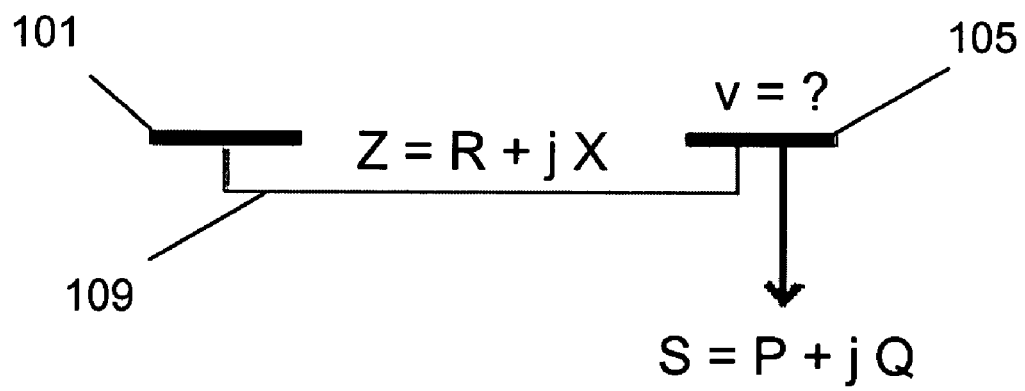
FIG. 1 is a representation of a two-bus system.

Referring to FIG. 1, the general load flow problem has at least one swing node 101 and a set of nodes (generation and/or load). In the very simple minimalist example chosen, we will only have one node 105 as well as the swing node 101. This swing node 101 does not vary its voltage value no matter how load and topology may vary in the rest of the network. It acts as a large generator or substation capable of providing any power required by the system. Only active power and reactive power are calculated at the swing bus, balancing the sum of both at the rest of the nodes.

An alternate current in stationary regime satisfies Ohms law with complex values. This is the origin of the complex values (X inductance, V voltage, R reactance) used in our problem.

Ohms Law for this simple system is simply:

$$V-V0=ZI$$

where V0 is the initial voltage, I is the complex intensity, and Z the impedance. The trivial solution is $$V=V0+ZI$$

Since V0 and Z are known, if the intensity I consumed at the load node is given, the complex V value is easily computed (singular Z=0 is a short circuit and we exclude it).

In our example, the circuit has only two nodes or buses: the swing node 101 with complex voltage fixed at V0=1, i.e., |V0| is 1, and its angle or phase is 0.

The other node 105 is a load, and the goal is to calculate the value of the complex voltage: module and phase equivalent to real and imaginary parts.

The network has only one link 109 joining both nodes 101, 105 with an impedance:

$$Z=R+j\,X\,(j\text{ complex unit, }R\text{ Reactance, }X\text{ inductance}).$$

In general you do not know I (not easily measurable values in high and medium voltage nodes), which could reduce the load flow problem to a linear one easily solved by matrix inversion. Loads are only known at complex power values, that is P: Active power and Q: Reactive power, the first value being the object to be billed, and easily measured at transformers level.

Let S be the complex power:

$$S=P+j\,Q$$

The relation among these is:

$$S=V\,I^*$$

Where * stands for the complex conjugate. Therefore, Ohms Law becomes:

$$V=V0+ZS^*/V^*$$

This, unfortunately, is the quadratic and non-linear equation that has to be solved for larger N: number of nodes. This is the real difficult problem of Load Flow calculation.

In this simple example, the equation system may be solved as follows. Solution for V0<>1 is similar to the case V0=1. Let H be $$H=ZS^*=(RP+XQ)+j(XP-RQ)$$

$$VV^*=V^*+H$$

$$VR^2+VI^2=VR-j\,VI+HR+j\,HI$$

The imaginary equation gives us VI:

$$VI=HI$$

Substitution in the real part:

$$VR^2+HI^2=VR+HR$$

$$VR^2-VR-(HR-HI^2)=0$$

$$VR=\tfrac{1}{2}+-sqrt(\tfrac{1}{4}+HR-HI^2)$$

We also obtain the Power real part.
   $HR-HI^2<-\tfrac{1}{4}$ there is no physical solution.
   $HR-HI^2>-\tfrac{1}{4}$ the solution is double: one physical and one spurious (i.e., spurious is equal to Vf+2k II where Vf is the correct physical solution).

$HR-HI^2=-\tfrac{1}{4}$ in the limit both solutions coalesce, both branches coincide and with more load there is voltage collapse.

This problem can be solved by using Newton-Raphson, selecting some initial value condition. Depending on the initial value, Newton-Raphson will converge to the physical solution, the spurious one, or not converge at all. The interesting point is that the set of points for which the problem will converge to the physical solution is a fractal: we can find two values as close as desired having convergence to the physical solution for the first one and convergence to the spurious, or no convergence, for the other.

Additionally, if you increase the load, the set of points without convergence grows up until it covers all the possibilities except the solution at the voltage collapse point.

In this simplistic example, the new method to be introduced behaves in an excellent manner with regard to approaching voltage collapse. For this problem, there is no need of initial condition, and the physical solution will always be found, including those situations very near to the voltage collapse point.

Extending the chaotic behavior of this two-bus model to larger networks using traditional methods, it is clear that unreliable results can be introduced near voltage collapse for transmission grids.

The method of the invention is a deterministic, non-iterative process to finding the solution to the load flow problem that behaves well near voltage collapse. The method converges universally if the problem admits a solution, and never if the problem does not have a feasible physical solution. The following discussion provides a constructive procedure for producing such solution to the load flow problem. However, in order to present such procedure, it is first necessary to establish the following principles:

1. The physical solution must be connected in a continuous way to the non-load and non-generation case in which all the voltages are equal to the normal or designed voltage level and there is no energy flow in the links. The reason for this lies in the fact that the no load case is physical (it is possible to build a real electrical power system with this state) and any other physical state can be reached by increasing simultaneously in a continuous way, load and generation until the final state is reached.

2. The quantities that appear in the equations (voltages, power, and flows that are complex numbers) are constrained to have functional relations between them (Holomorphic function) with a very strong property called analyticity. This is a property of functions defined in the complex plane that reflects deeper symmetries of the system than is represented by the functions. In this case, analyticity is a property implied in the definition of the Ohm and Kirchov laws and, thus, by the load flow equations.

Holomorphic functions are the central object of study of complex analysis; they are functions defined on an open subset of the complex number plane C with values in C that are complex-differentiable at every point. This is a much stronger condition than real differentiability and implies that the function is infinitely often differentiable and can be described by its Taylor series (Power series expansion). The term analytic function is often used interchangeably with "holomorphic function", although note that the former term has several other meanings.

Using these two facts as a framework, we define the method for finding a physical solution of the load flow problem in the following steps:

a. Embed the load flow problem L in a holomorphic embedding L(s) that goes continuously from the no load case (L(s=0)) to the problem or objective case (L(s=1)).

b. Develop, in power series, the values of the equation's unknowns in the parameters of the holomorphic embedding in a neighborhood of the no load case value of the parameter.

c. Use analytical continuity (by an n-order algebraic approximant) to find the value for the equation's unknowns in the problem case.

For suitable analytical continuation techniques using algebraic approximants (continued fractions, for instance), it is possible to prove that this procedure always gives the correct solution (i.e., the physical one) when it exists. If no solution exists then the power system is undergoing voltage collapse.

Details of the basic steps to calculate the solution with the method of the invention for general N are the following.

First, we construct an embedding, defined as an extension of the function domain in one new variable, transforming the load flow equations into a function of a single complex variable.

For an n-bus case, let Yij be the admittance matrix of an n-buses network (0 is a swing bus), with Si and Vi the complex power and complex voltage at bus i. The load flow equations (L) can be written as $$\frac{S_i^*}{V_i^*} = \sum_{k=0}^{N} Y_{ik} V_k \tag{0.1}$$

In order to solve the load flow equation, we define an holomorphic embedding in a family of problems depending on a complex parameter s such that we know the solution for s=0 (no load case), and for s=1 we recover the original equations.

As the equations are holomorphic, the knowledge of the power series expansion for a single value of s determines, in a unique way, the values of the equations for all possible values s in the complex plane. Notice that in this case, knowledge of the power series expansion at one point is equivalent to knowledge of the full function for all s values. The holomorphic equation permits this because a holomorphic function is defined as a complex function on complex variables and is complex-differentiable at every point. This is the main difference with the methodologies related to the homotopy continuation method, restricted to a real parameter, in which is necessary to follow a path in a predictor-corrector way by using only first order derivatives (not the full power series expansion).

One of the possible embeddings is:

$$\frac{sS_i^*}{V_i^*(s)} = \sum_{k=0}^{N} Y_{ik} V_k(s) - (1-s)\sum_{k=0}^{N} Y_{ik} \tag{0.2}$$

$$V_0(s) = 1 + (1-s)V_0$$

$$V_k(0) = 1, \forall k$$

$$V_k(1) = V_k, \forall k$$

Next, we define a functional transform from the analytical functions to the infinite sequences set:

$$\tau: f(s) \to f[n] = \frac{1}{n!}\left[\frac{\partial^n f(s)}{\partial s^{(n)}}\right]_{s=0} \tag{0.3}$$

where f[n] is the n coefficient of the MacLaurin series expansion of f(s).

$$L \to L(s)$$

L:
$$y_{11}v_1 + y_{12}v_2 + \ldots + y_{1N}v_n = \frac{S_1^*}{v_1^*}$$
$$y_{21}v_1 y_{22}v_2 + \ldots + y_{2N}v_n = \frac{S_2^*}{v_2^*}$$
$$y_{NI}v_1 + y_{N2}v_2 + \ldots + y_{NN}v_n = \frac{S_N^*}{v_N^*}$$

L(s):
$$y_{11}v_1(s) + y_{12}v_2(s) + \ldots + y_{1N}v_n(s) = s\frac{S_1^*}{v_1^*}$$
$$y_{21}v_1(s) + y_{22}v_2(s) + \ldots + y_{2N}v_n(s) = s\frac{S_2^*}{v_2^*}$$
$$y_{NI}v_1(s) + y_{N2}v_2(s) + \ldots + y_{NN}v_n(s) = s\frac{S_N^*}{v_N^*}$$

$$f(s)=f[0]+f[1]s+f[2]s^2+\ldots f[n]s^n+ \tag{0.4}$$

with the properties $$\tau(f(s)) = f[n] \quad (0.5)$$

$$\tau(1) = \delta_{n0}$$

$$\tau(s) = \delta_{n1}$$

$$\tau(sf(s)) = f[n-1]$$

$$\tau(f(s)g(s)) = (f*g)[n] = \sum_{k=0}^{n} f[k]g[n-k]$$

We rewrite (0.2) as $$\sum_{k=1}^{N} Y_{ik} V_k(s) = sS_i^* W_i^*(s) - Y_{i0} V_0(s) - (1-s)\sum_{k=0}^{N} Y_{ik} \quad (0.6)$$

$$W_i(s) \equiv \frac{1}{V_i(s)}$$

Applying the transform to both sides of the equation, we get $$\sum_{k=1}^{N} Y_{ik} V_k[n] = \quad (0.7)$$

$$S_i^* W_i^*[n-1] - Y_{i0}(1-(\delta_{n0}-\delta_{n1})V_0) - (\delta_{n0}-\delta_{n1})\sum_{k=0}^{N} Y_{ik}$$

defining a recurrence over n taking into account that $$W_i(s)V_i(s) = 1 \Rightarrow (W_i * V_i)[n] = \delta_{n0} \quad (0.8)$$

$$W_i[0] = \frac{1}{V_i[0]} = 1$$

$$W_i[n] = -\sum_{k=0}^{n-1} W_i[k]V_i[n-k]$$

\* being the sequence convolutions operator.

The steps to calculate the coefficients in the series expansion to order n are i) Initialization $$V_i[0] = W_i[0] = 1 \quad (0.9)$$

ii) For m=1 to n
Calculate Vi[m] solving the linear system (0.7).
Calculate Wi[m] using (0.8).

Figure 2:
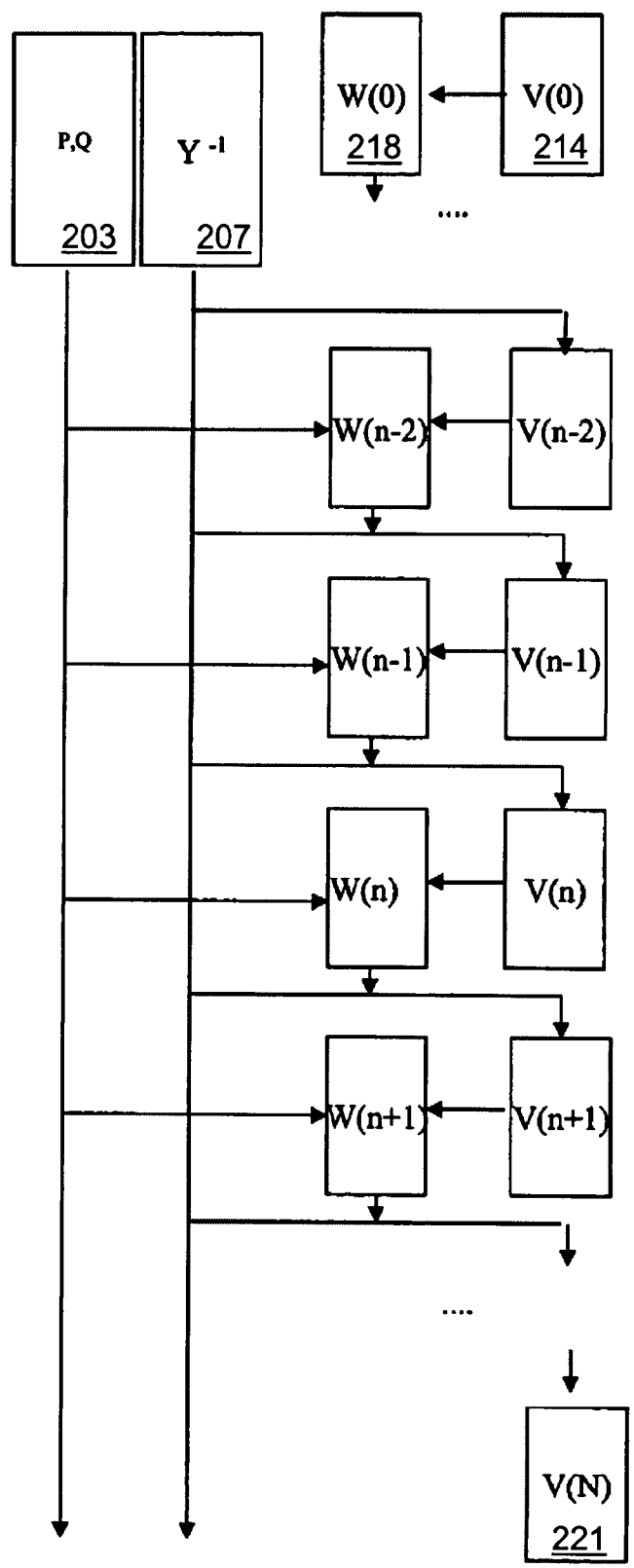
FIG. 2 is a schematic representation of a method for determining power series coefficients for voltages V[n].

The entire process is represented in FIG. 2 in which P, Q 203 represents power, that is P: Active power and Q: Reactive power; $Y^{-1}$ 207 represents admittance; V( ) 214 represents voltage; and W( ) 218 represents the calculation in the series. V(N) 221 is the calculated solution voltage.

This will give the power series expansion of Vi(s) up to order n. In general, however, this series will not converge for s=1. Nevertheless, a continued fraction expansion of the power series will converge for all s values when voltages are given inside the solution set continuously connected to the s=0 case (no load).

Next, from the series coefficients, it is possible to build an n-order algebraic approximant for the function obtained by analytic continuation from the point s=0 to s=1. There is a proof assuring that if the set of equations has a solution in the physical branch, it is always possible to find a continuation path from s=0 (no charge) to s=1, free of singularities, and obtain the solution to the equation by evaluating the algebraic approximant for s=1.

An algorithm for constructing an algebraic approximant (e.g., a continued fraction approximation) to a power series is the well known Viskovatov method, as described in A. Bultheel, "Division Algorithms for Continued Fractions and the Padé Table," J. Comp. Appld. Math. No. 6, 1980, which is incorporated herein by reference. Another methodology is to use Padé-Hermite Approximants or any technique capable of computing an algebraic approximant from the power series of an analytical function, as described in George A. Baker and Peter Graves-Morris, "Padé Approximants, Second Edition," Encyclopedia of Mathematics and its Applications, Volume 59 (Cambridge University Press, 1996), which is incorporated herein by reference.

For clarity, we will explain the Viskovatov approach used within our process. It is inspired in a "double inversion" of the power series.

$$f(s) = f[0] + f[1]s + f[2]s^2 + \ldots + f[n]s^n + \ldots = \quad (0.10)$$

$$= f[0] + s(f[1] + f[2]s + \ldots + f[n]s^{n-1} + \ldots) =$$

$$= f[0] + \frac{s}{\frac{1}{f[1] + f[2]s + \ldots + f[n]s^{n-1} + \ldots}} =$$

$$= f[0] + \frac{s}{f^{(1)}(s)}$$

with $$f^{(1)}(s) = \frac{1}{f[1] + f[2]s + \ldots + f[n]s^{n-1} + \ldots} =$$

$$f^{(1)}[0] + f^{(1)}[1]s + \ldots + f^{(1)}[n-1]s^{n-1} + \ldots$$

$$f(s) = f[0] + \cfrac{s}{f^{(1)}[0] + \cfrac{s}{\cfrac{1}{f^{(1)}[1] + \ldots + f^{(1)}[n-1]s^{n-2} + \ldots}}} =$$

$$= f[0] + \cfrac{s}{f^{(1)}[0] + \cfrac{s}{f^{(1)}[0] + \cfrac{s}{f^{(3)}[0] + \ldots}}}$$

The $f^{(i+1)}$ power series calculation can be performed using the $f^{(i)}$ power series applying the (0.9) recursion set forth above. Here, the power series f particularly corresponds to the v function (voltage) and w (its inverse).

After that, the n-order approximant An(s)/Bn(s) of the previous continued fraction can be evaluated using the recursion relation:

$$A_0(s) = f[0], A_1(s) = f[0]f^{(1)}[0] + s$$

$$A_i(s) = f^{(i)}[0]A_{i-1}(s) + sA_{i-2}(s), i=2,3,4 \quad (0.11)$$

$$B_0(s) = 1, B_1(s) = f^{(1)}[0]$$

$$B_i(s) = f^{(i)}[0]B_{i-1}(s) + sB_{i-2}(s), i=2,3,4 \quad (0.12)$$

Evaluating the n-order approximant An(s)/Bn(s) for the calculated Vi(s) power series in (0.9) for s=1, giving V(s=1) will give the solution to the original load flow problem, as can be seen from (0.2).

Figure 3:
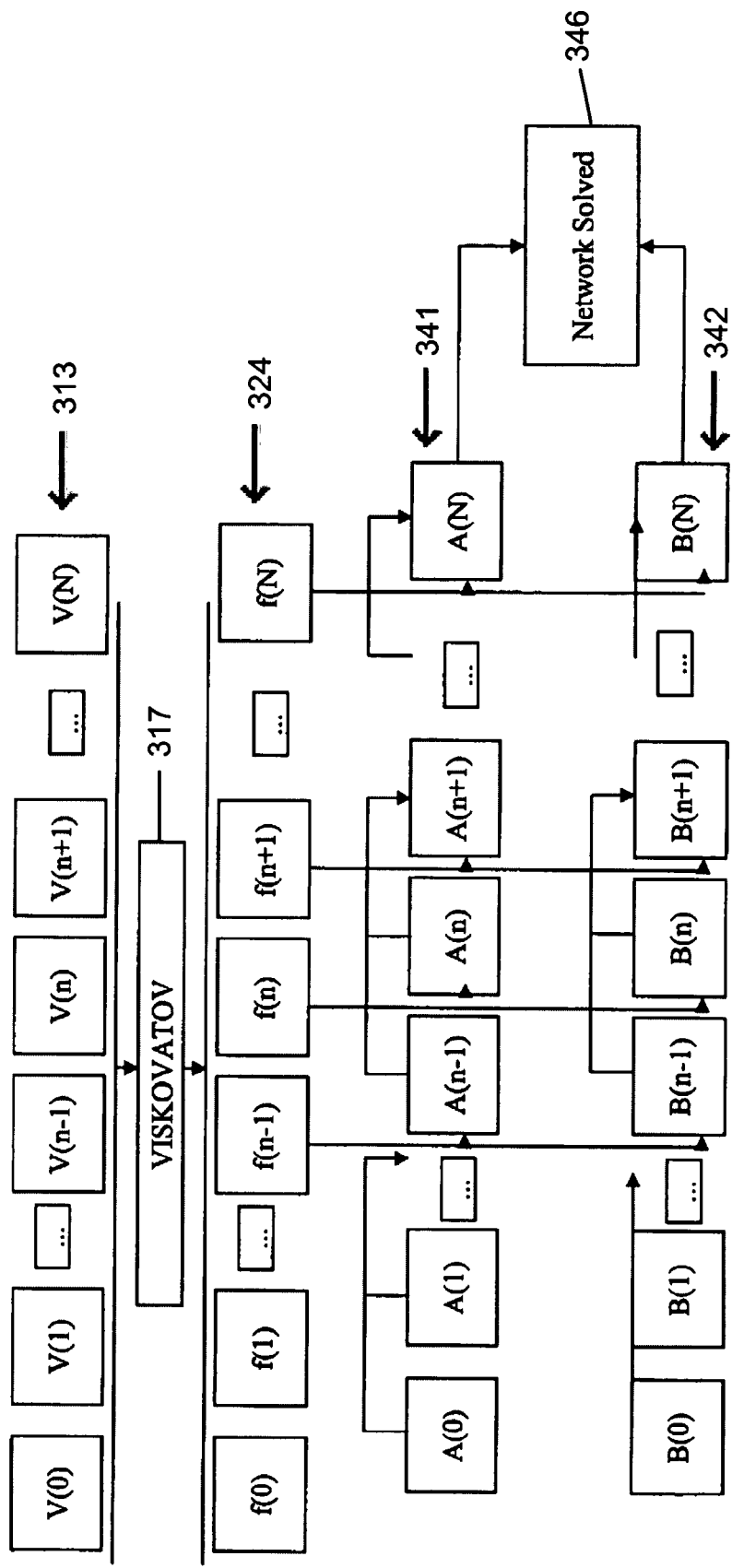
FIG. 3 is a schematic representation of a method for evaluating an n-order approximant of a continued fraction approximation for the power series coefficients produced by the method depicted in FIG. 2 to provide a solution to the load flow equations (L).

FIG. 3 shows the scheme of the computational process to get the n-order approximant for the calculated Vi(s). More particularly, we begin from the power series coefficients for the voltages V[n] 313 (calculated using the schema of FIG. 2). Using those power series coefficients, and applying an algebraic approximant 317 (e.g., a continued fraction methodology, such as Viskovatov, Padé-Hermite Approximants, or other continued fraction methodologies), we build the f[n] continuous fraction 324. In order to evaluate, it is necessary to build the series of approximants A[n]/B[n] using the f[n] and the two previous coefficients of the A and B series 341, 342, respectively. Finally, using the approximant of high order A[n]/B[n], and evaluating them for s=1, we are, in fact, calculating the V 346 solution to the initial problem.

The above described method for determining the load flow in an electric power generating system may be employed in a number of aspects for general management of the electrical grid, including observation and estimation of the network state, voltage stability and contingency analysis, optimal power flow, limit controls, and system restoration following a voltage collapse. Described below in greater detail is one such aspect concerning state estimation. However, other applications may likewise utilize the above-described method, particularly including: the generation of dynamic restoration plans as a path search method; generalized OPF as a path search method and limit controls as a boundary case; improved methods for generating PV and QV curves indirectly through substitution of available load flow techniques by the above-described method; determination of voltage collapse region characteristics using zeroes and poles of the approximants; and voltage stability analysis and contingency analysis indirectly through substitution of available load flow techniques by the above-described method.

With particular reference to a method for state estimation, reference is made to FIG. 4, which provides a schematic overview of such method. Data coming from the field includes loads generations, voltages, flows, and the state of breakers, among others. The network topology describes the possible connectivity of the electrical network.

After receiving the data from the field and the topology of the model, a battery of tests 1102 using Artificial Intelligence are done in order to make inferences on the missing information and quality of the available measurements from the electrical laws. The tests include logical considerations about the connections and the measures observed.

Dynamic assignment 1104 of a quality parameter that is historically followed is done, such quality parameter being the result a very robust estimator with no need for a very high percentage of observable measures. The quality parameter is calculated from the historical comparison between the field measurement and their estimated value. This quality parameter expresses the confidence in the field measurements and is used as a weight in the estimation process. It calculates for the complete network, thus avoiding the effort traditionally necessary to work with an external model and then propagate to an internal one.

The State Estimation process 1106 consists on standard least square minimization on the weighted differences and takes place using Gauss Seidel.

The above-described method for determining the load flow in the network allows us to accept only feasible physical states (continuously connected to the no-charge solution). Only these states can be seen in the field. Hence, we require every state estimation to always run the load flow 1108.

If we do not get a solution and the electric system is not at voltage collapse 1110, there can be no more than three reasons: (i) synchronization problems of snapshots 1112 (measures from different temporal intervals are used); (ii) measurement problems (error in the measurement device or the communication line); or (iii) modeling problems (errors in the static parameters defining the model) 1114, 1116. This simple result has allowed a very powerful diagnostic and calibration kit for quickly attaining an improved model closer to the physical grid than has been available from prior art systems, as well as improvements in the detection and, hence, correction of the bad quality of certain measures. We can estimate even in the region of voltage collapse giving utility operators the support of reliable calculations when such information is needed the most.

What is claimed is:

1. A computer implemented method for determining a state of stability of an electrical grid having n nodes, comprising the steps of:

a. embedding load flow equations (L) representing the electrical grid in a holomorphic embedding (L(s)) where s is a variable in a complex domain that includes a value s=0 corresponding to a no load case (L(0)), in which all voltages are equal to a normal or designed voltage level and there is no energy flow in links of the electrical grid and the value s=1 corresponding to an objective case (L(1)) representative of the electrical grid in a condition for which stability is to be determined, wherein each variable of the load flow equations (L) is contained in L(s) as a function of the complex variable s by said holomorphic embedding, and transcribing the holomorphic embedding into software for use in a computer processor adapted to execute said software;

b. developing in power series, values of unknowns in parameters of the holomorphic embedding (L(s)), using said computer processor, wherein the values of s are in a neighborhood of the value for the no load case of each parameter of the load flow equations;

c. using said computer processor to compute an n-order algebraic approximant to the power series produced in step b;

d. said computer processor evaluating the n-order algebraic approximant produced in step c for the power series produced in step b to provide a solution to the load flow equations (L); and e. displaying the solution to the load flow equations as a measure of a state of stability of the electrical grid.

2. The method of claim 1, further comprising the steps of: prior to said embedding step, receiving data from a supervisory and data acquisition system representative of conditions of the electrical grid, and forming said load flow equations (L) from said data.

3. The method of claim 2, further comprising the steps of repeating said receiving step and steps a through e continuously to provide a continuous, real time estimation of the state of stability of the electrical grid.

4. The method of claim 3, further comprising the steps of confirming that a set of voltages and flows contained in said solution to said load flow equations (L) are representative of a physical electrical state.

5. A computer implemented method of measuring load flow in a power generating system having an electrical grid comprised of n nodes, comprising the steps of:

a. embedding load flow equations (L) representing the electrical grid in a holomorphic embedding (L(s)) where s is a variable in a complex domain that includes a value s=0 corresponding to a no load case (L(0)), in which all voltages are equal to a normal or designed voltage level, and there is no energy flow in links of the electrical grid and the value s=1 corresponding to an objective case (L(1)) representative of the electrical grid in a condition for which stability is to be determined, wherein each variable of the load flow equations (L) is contained in L(s) as a function of the complex variable s by said holomorphic embedding, and transcribing the holomorphic embedding into software for use in a computer processor adapted to execute said software;

b. developing in power series, values of unknowns in parameters of the holomorphic embedding (L(s)), using said computer processor, wherein the values of s are in a neighborhood of the value for the no load case of each parameter of the load flow equations;

c. using said computer processor to compute an n-order algebraic approximant to the power series produced in step b;

d. said computer processor evaluating the n-order algebraic approximant produced in step c for the power series produced in step b to provide a solution to the load flow equations (L); and e. displaying the solution to the load flow equations as a measure of the load flow in the power generating system.

6. The method of claim 5, further comprising the steps of:
prior to said embedding step, receiving data from a supervisory and data acquisition system representative of conditions of the electrical grid, and forming said load flow equations (L) from said data.

7. The method of claim 6, further comprising the steps of repeating said receiving step and steps a through e continuously to provide a continuous, real time measure of the load flow in the power generating system.

8. A system for measuring load flow in a power generating system having an electrical grid having n nodes, said system comprising:

a supervisory control and data acquisition system adapted to collect data from said electrical grid indicative of electrical conditions in said electrical grid, said supervisory control and data acquisition system being in communication with a microprocessor-controlled energy management system, said energy management system further comprising executable computer instructions to:

a. process said data received from said supervisory control and data acquisition system into load flow equations (L) representing the electrical grid;

b. embed said load flow equations (L) representing the electrical grid in a holomorphic embedding (L(s)) where s is a variable in a complex domain that includes a value s=0 corresponding to a no load case (L(0)), in which all voltages are equal to a normal or designed voltage level and there is no energy flow in links of the electrical grid and the value s=1 corresponding to an objective case (L(1)) representative of the electrical grid in a condition for which stability is to be determined, wherein each variable of the load flow equations (L) is contained in L(s) as a function of the complex variable s by said holomorphic embedding;

c. develop in power series, values of unknowns in parameters of the holomorphic embedding (L(s)) wherein the values of s are in a neighborhood of the value for the no load case of each parameter of the load flow equations;

d. compute an n-order algebraic approximant to the power series produced in step c;

e. evaluate the n-order algebraic approximant produced in step d for the power series produced in step c to provide a solution to the load flow equations (L); and f. display the solution to the load flow equations as a measure of a state of stability of the electrical grid.

* * * * *